United States Patent
Son et al.

(10) Patent No.: US 10,833,032 B2
(45) Date of Patent: Nov. 10, 2020

(54) SEMICONDUCTOR DEVICE

(71) Applicant: Samsung Electronics Co., Ltd., Suwon-si, Gyeonggi-do (KR)

(72) Inventors: Seong-Min Son, Hwaseong-si (KR); Jeong-Gi Jin, Seoul (KR); Jin-Ho An, Seoul (KR); Jin-Ho Chun, Seoul (KR); Kwang-Jin Moon, Hwaseong-si (KR); Ho-Jin Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/052,383

(22) Filed: Aug. 1, 2018

(65) Prior Publication Data
US 2019/0067228 A1    Feb. 28, 2019

(30) Foreign Application Priority Data

Aug. 22, 2017 (KR) ........................ 10-2017-0106313

(51) Int. Cl.
    *H01L 23/00*               (2006.01)
    *H01L 23/485*             (2006.01)
    *H01L 23/522*             (2006.01)

(52) U.S. Cl.
CPC ............ *H01L 24/13* (2013.01); *H01L 23/485* (2013.01); *H01L 23/5226* (2013.01); *H01L 24/02* (2013.01); *H01L 24/03* (2013.01); *H01L 24/05* (2013.01); *H01L 24/11* (2013.01); *H01L 24/73* (2013.01); *H01L 24/81* (2013.01); *H01L 24/83* (2013.01); *H01L 24/92* (2013.01); *H01L 24/16* (2013.01); *H01L 24/32* (2013.01); *H01L 2224/0239* (2013.01); *H01L 2224/02311* (2013.01); *H01L 2224/02313* (2013.01); *H01L 2224/02331* (2013.01); *H01L 2224/02371* (2013.01); *H01L 2224/02372* (2013.01); *H01L 2224/036* (2013.01); *H01L 2224/0345* (2013.01); *H01L 2224/0347* (2013.01);
(Continued)

(58) Field of Classification Search
CPC .... H01L 24/13; H01L 23/5226; H01L 23/485
See application file for complete search history.

(56) References Cited

U.S. PATENT DOCUMENTS

| | | | |
|---|---|---|---|
| 7,078,331 B2 | 7/2006 | Kwon et al. | |
| 7,545,027 B2 | 6/2009 | Chung et al. | |
| 7,863,745 B2* | 1/2011 | Nomoto | H01L 21/561 257/642 |
| 7,956,442 B2 | 6/2011 | Hsu et al. | |

(Continued)

FOREIGN PATENT DOCUMENTS

| | | |
|---|---|---|
| JP | 5520425 | 6/2014 |
| JP | 5686838 | 3/2015 |

(Continued)

*Primary Examiner* — Dung A. Le
(74) *Attorney, Agent, or Firm* — Myers Bigel, P.A.

(57) ABSTRACT

A semiconductor device includes a protective layer, a redistribution pattern, a pad pattern and an insulating polymer layer. The protective layer may be formed on a substrate. The redistribution pattern may be formed on the protective layer. An upper surface of the redistribution may be substantially flat. The pad pattern may be formed directly on the redistribution pattern. An upper surface of the pad pattern may be substantially flat. The insulating polymer layer may be formed on the redistribution pattern and the pad pattern. An upper surface of the insulating polymer layer may be lower than the upper surface of the pad pattern. The semiconductor device may have a high reliability.

20 Claims, 13 Drawing Sheets

(52) U.S. Cl.
CPC ............... *H01L 2224/03452* (2013.01); *H01L 2224/03462* (2013.01); *H01L 2224/03914* (2013.01); *H01L 2224/0401* (2013.01); *H01L 2224/05008* (2013.01); *H01L 2224/05166* (2013.01); *H01L 2224/05181* (2013.01); *H01L 2224/05187* (2013.01); *H01L 2224/05548* (2013.01); *H01L 2224/05644* (2013.01); *H01L 2224/05647* (2013.01); *H01L 2224/05655* (2013.01); *H01L 2224/05676* (2013.01); *H01L 2224/05684* (2013.01); *H01L 2224/119* (2013.01); *H01L 2224/1147* (2013.01); *H01L 2224/1181* (2013.01); *H01L 2224/1191* (2013.01); *H01L 2224/11462* (2013.01); *H01L 2224/131* (2013.01); *H01L 2224/13022* (2013.01); *H01L 2224/13024* (2013.01); *H01L 2224/13144* (2013.01); *H01L 2224/13147* (2013.01); *H01L 2224/13155* (2013.01); *H01L 2224/13176* (2013.01); *H01L 2224/13184* (2013.01); *H01L 2224/16145* (2013.01); *H01L 2224/32145* (2013.01); *H01L 2224/73104* (2013.01); *H01L 2224/73204* (2013.01); *H01L 2224/81193* (2013.01); *H01L 2224/81203* (2013.01); *H01L 2224/81801* (2013.01); *H01L 2224/8385* (2013.01); *H01L 2224/83191* (2013.01); *H01L 2224/83203* (2013.01); *H01L 2224/9211* (2013.01)

(56) References Cited

U.S. PATENT DOCUMENTS

| | | | |
|---|---|---|---|
| 8,089,777 B2* | 1/2012 | Negishi | H01L 23/5389 |
| | | | 257/E21.499 |
| 8,957,526 B2 | 2/2015 | Chun et al. | |
| 9,087,832 B2* | 7/2015 | Huang | H01L 23/49827 |
| 9,087,885 B2 | 7/2015 | Ji et al. | |
| 9,449,913 B2 | 9/2016 | Lee et al. | |
| 2003/0089868 A1 | 5/2003 | Ito et al. | |
| 2003/0189248 A1* | 10/2003 | Estacio | H01L 23/4824 |
| | | | 257/737 |
| 2004/0094841 A1* | 5/2004 | Matsuzaki | H01L 21/56 |
| | | | 257/758 |
| 2004/0253803 A1* | 12/2004 | Tomono | H01L 21/563 |
| | | | 438/614 |
| 2011/0045668 A1 | 2/2011 | Jeon et al. | |
| 2011/0281430 A1 | 11/2011 | Lee | |
| 2015/0255406 A1* | 9/2015 | Miao | H01L 24/11 |
| | | | 257/684 |
| 2016/0240499 A1 | 8/2016 | Yamada et al. | |
| 2017/0188458 A1* | 6/2017 | Hsieh | H05K 1/111 |
| 2018/0294214 A1* | 10/2018 | Aoki | H01L 23/49827 |

FOREIGN PATENT DOCUMENTS

| | | |
|---|---|---|
| KR | 20050011404 | 1/2005 |
| KR | 100561638 | 3/2006 |

* cited by examiner

US 10,833,032 B2

SEMICONDUCTOR DEVICE

CROSS-REFERENCE TO RELATED APPLICATION

This application claims priority under 35 USC § 119 to Korean Patent Application No. 10-2017-0106313, filed on Aug. 22, 2017 in the Korean Intellectual Property Office (KIPO), the contents of which are herein incorporated by reference in their entirety.

FIELD

Example embodiments relate to semiconductor devices. More particularly, example embodiments relate to semiconductor devices including a pad pattern contacting a conductive bump.

BACKGROUND

As semiconductor devices have been highly integrated, processes for assembling and packaging upper and lower chips have been developed. To electrically connect an upper chip and a lower chip, a conductive bump may be formed between a pad pattern of the lower chip and a pad pattern of the upper chip. The upper and lower chips may be bonded to each other using a non-conductive film (NCF). However, reliability failures may occur if the NCF intrudes between the pad patterns and the conductive bump.

SUMMARY

Example embodiments provide semiconductor devices having high reliability.

According to example embodiments, there is provided a semiconductor device. The semiconductor device includes a protective layer, a redistribution pattern, a pad pattern and an insulating polymer layer. The protective layer may be formed on a substrate. The redistribution pattern may be formed on the protective layer. An upper surface of the redistribution may be substantially flat. The pad pattern may be formed directly on the redistribution pattern. An upper surface of the pad pattern may be substantially flat. The insulating polymer layer may be formed on the redistribution pattern and the protective layer. An upper surface of the insulating polymer layer may be lower than the upper surface of the pad pattern.

According to example embodiments, there is provided a semiconductor device. The semiconductor device includes a through silicon via (TSV) structure, a redistribution pattern, a pad pattern, an insulating polymer layer, an upper pad pattern, a conductive bump and non-conductive film (NCF). The TSV structure may extend through a substrate. The redistribution pattern may be formed on a backside of the substrate. The redistribution pattern and the TSV structure may be electrically connected with each other. The pad pattern may be formed directly on the redistribution pattern. The upper surface of the pad pattern may be substantially flat. The insulating polymer layer may extend on or cover an upper surface of the redistribution pattern and a lower sidewall of the pad pattern. The upper pad pattern may be beneath an upper chip. The upper pad pattern may be opposite to the upper surface of the pad pattern. The conductive bump may be formed between the pad pattern and the upper pad pattern. The upper pad pattern and the pad pattern may be electrically connected with each other via the conductive bump. The NCF may fill a gap between the insulating polymer layer and the upper chip. The insulating polymer layer and the upper chip may be bonded to each other by the NCF.

According to example embodiments, there is provided a method of manufacturing a semiconductor device. In the method, a through silicon via (TSV) structure may extend through a substrate. A redistribution pattern may be formed on a backside of the substrate. The redistribution pattern and the TSV structure may be electrically connected with each other. A pad pattern may be directly formed on the redistribution pattern. An upper surface of the pad pattern may be substantially flat. An insulating polymer layer may extend on or cover an upper surface of the redistribution pattern and a lower sidewall of the pad pattern. A non-conductive film (NCF) may be formed on the insulating polymer layer and the pad pattern. An upper pad pattern of an upper chip may be pressed onto a conductive bump on the pad pattern, so that the upper pad pattern and the pad pattern may be electrically connected with each other via the conductive bump.

According to example embodiments, a semiconductor device includes a protective layer on a substrate, a redistribution pattern on the protective layer, a pad pattern, and an insulating polymer layer. The pad pattern has a lower surface directly on the redistribution pattern, an upper surface opposite the lower surface, and a sidewall that linearly extends from the upper surface to the lower surface. An interface between the lower surface and the redistribution pattern is planar. The insulating polymer layer is on the redistribution pattern and is directly on the sidewall of the pad pattern.

As illustrated above, the non-conductive film may not remain between the pad pattern and the conductive bump, so that the semiconductor device may have a high reliability.

DESCRIPTION OF EMBODIMENTS

Figure 1A:
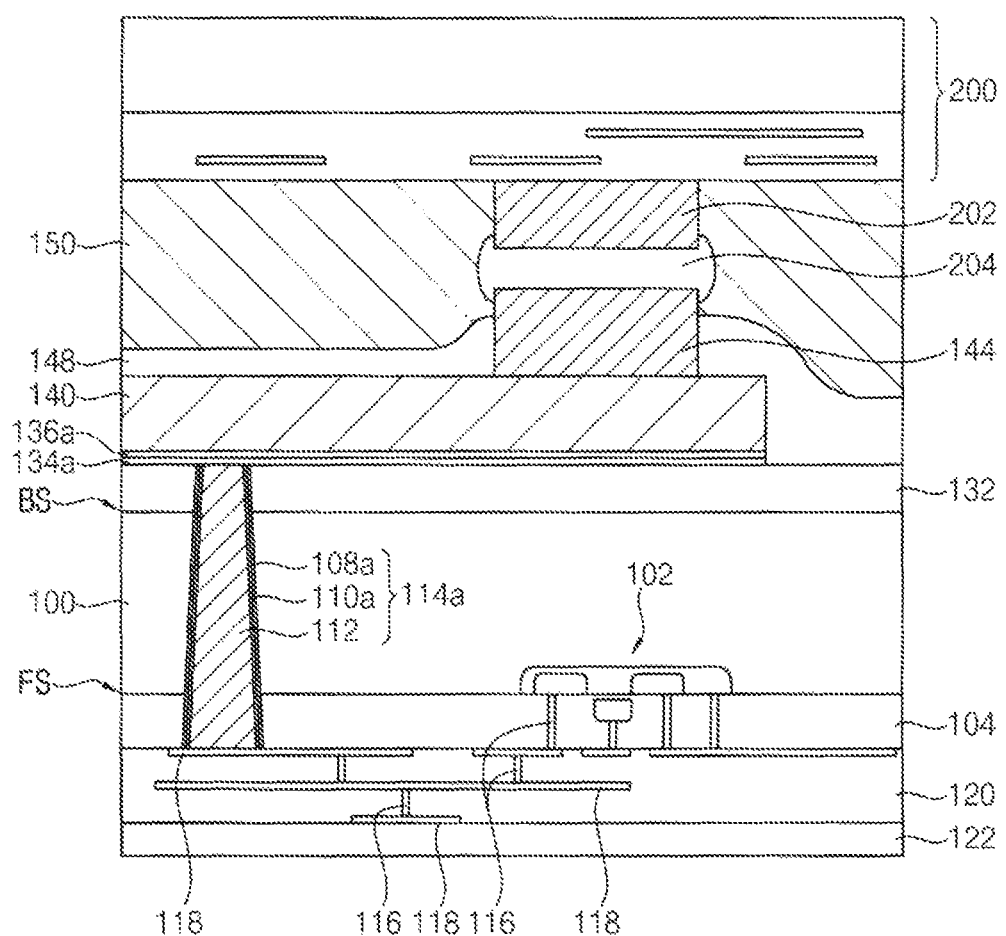
FIG. 1A is a cross-sectional view illustrating a semiconductor device in accordance with example embodiments.
Figure 1B:
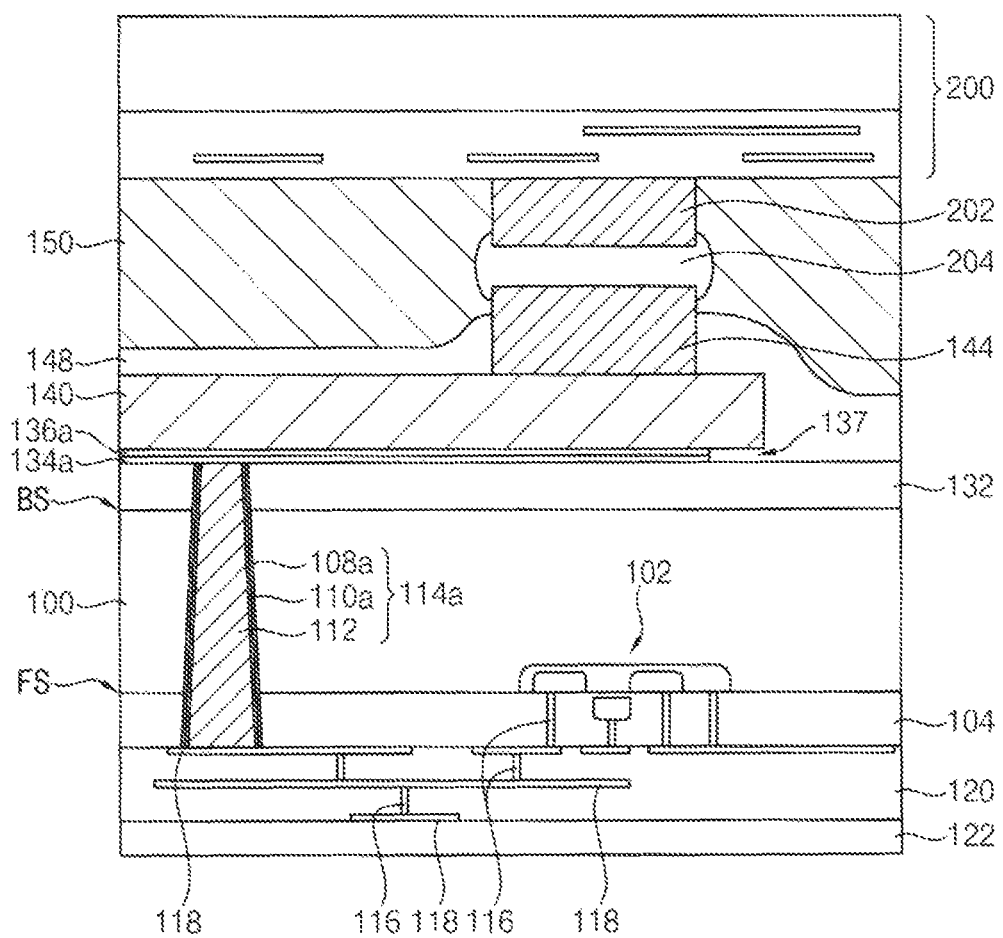
FIG. 1B is a cross-sectional view illustrating a semiconductor device in accordance with example embodiments.

FIG. 1A is a cross-sectional view illustrating a semiconductor device in accordance with example embodiments. FIG. 1B is a cross-sectional view illustrating a semiconductor device in accordance with other example embodiments.

The semiconductor device illustrated in FIG. 1B may be substantially the same as the semiconductor device illustrated in FIG. 1A, except for the shapes of a barrier pattern and a seed layer pattern.

Referring to FIG. 1A, the semiconductor device may include a through silicon via (TSV) structure 114a, a redistribution pattern 140, a pad pattern 144, an insulating polymer layer 148 and a conductive bump 204. The TSV structure 114a may extend through a substrate 100. The redistribution pattern 140 may be formed on a backside of the substrate 100, and may be electrically connected with the TSV structure 114a. The pad pattern 144 may be formed on the redistribution pattern 140. The insulating polymer layer 148 may extend on or cover the redistribution pattern 140 and a lower sidewall of the pad pattern 144. The conductive bump 204 may contact an upper surface and an upper sidewall of the pad pattern 144. The conductive bump 204 may be interposed between an upper pad pattern 202 included in an upper chip 200 and the pad pattern 144, so that the upper pad pattern 202 and the pad pattern 144 may be connected with each other via the conductive bump 204.

The substrate 100 may be a bulk substrate including a semiconductor material, e.g., silicon, silicon carbon, silicon-germanium, etc. In example embodiments, the substrate 100 may be a silicon-on-insulator (SOI) substrate, or a germanium-on-insulator (GOI) substrate.

The substrate 100 may have a front side and a backside. In FIGS. 1A and 1B, the backside of the substrate 100 is oriented above the front side thereof. As used herein, spatially relative terms, such as "beneath," "below," "lower," "higher," "above," "upper," and the like, may encompass different orientations of the device in use or operation in addition to the orientation depicted in the figures. For example, if the device in the figures is turned over, elements described as "below" or "beneath" other elements or features would then be oriented "above" the other elements or features.

A unit device 102 may be formed on the front side of the substrate 100. The unit device 102 may include, e.g., a MOS transistor. The TSV structure 114a may extend from the backside of the substrate 100 to the front side of the substrate 100. The TSV structure 114a may protrude from each of the backside and the front side of the substrate 100.

The TSV structure 114a may include a TSV liner 108a, a TSV barrier pattern 110a and a TSV contact 112. The TSV contact 112 may have a pillar shape. The TSV barrier pattern 110a and the TSV liner 108a may be sequentially stacked on a sidewall of the TSV contact 112, and the TSV barrier pattern 110a and the TSV liner 108a may extend on or surround the sidewall of the TSV contact 112.

The TSV liner 108a may include an insulation material. The TSV liner 108a may include, e.g., silicon oxide, silicon nitride, etc. The TSV barrier pattern 110a may include, e.g., titanium (Ti), titanium nitride (TiN), titanium tungsten (TiW), tantalum (Ta), tantalum nitride (TaN), tungsten (W), tungsten nitride (WN), etc. The TSV contact 112 may include, e.g., copper (Cu), ruthenium (Ru), nickel (Ni), gold (Au), tungsten (W), etc.

A first lower insulating interlayer 104 may be formed on the front side of the substrate 100 to extend on or cover the unit device 102. The first lower insulating interlayer 104 may include, e.g., silicon oxide.

Internal wirings 116 and 118 may be formed on the first lower insulating interlayer 104 and the TSV structure 114a. A second lower insulating interlayer 120 may be formed on the first lower insulating interlayer 104 to extend on or cover the internal wirings 116 and 118. In example embodiments, the internal wirings 116 and 118 may include a plurality of internal via contacts 116 and a plurality of internal via conductive lines 118. A lower protective layer 122 may extend on or cover the second lower insulating interlayer 120. The lower protective layer 122 may include, e.g., silicon nitride.

A first protective layer 132 may be formed on the backside of the substrate 100. In example embodiments, an upper surface of the first protective layer 132 may be substantially coplanar with an upper surface of the TSV structure 114a. In example embodiments, the first protective layer 132 may include, e.g., silicon nitride, silicon oxide, etc. In some example embodiments, the first protective layer 132 may include an insulating polymer, e.g., polyimide.

A barrier pattern 134a and a seed layer pattern 136a may be formed on the TSV structure 114a and the first protective layer 132.

The redistribution pattern 140 may be formed on the seed layer pattern 136a. In example embodiments, a thickness of the redistribution pattern 140 may be less than about 15 micrometers (μm). For example, the thickness of the redistribution pattern 140 may be about 1 μm to about 15 μm. An upper surface and a lower surface of the redistribution pattern 140 may be substantially flat.

The redistribution pattern 140 may include a metal, e.g., copper (Cu), ruthenium (Ru), nickel (Ni), gold (Au), tungsten (W), etc.

In example embodiments, as shown in FIG. 1A, sidewalls of the barrier pattern 134a, the seed layer pattern 136a and the redistribution pattern 140 may be aligned or arranged in a vertical line.

In some example embodiments, as shown in FIG. 1B, sidewalls of the barrier pattern 134a and the seed layer pattern 136a and a sidewall of the redistribution pattern 140 may not be aligned or arranged in a vertical line. A portion adjacent the sidewalls of the barrier pattern 134a and the seed layer pattern 136a under the redistribution pattern 140 may be referred to as an undercut portion 137.

The pad pattern 144 may be formed on the redistribution pattern 140. The upper surface and a lower surface of the pad pattern 144 may be substantially flat or planar. In example embodiments, a thickness of the pad pattern 144 may be about 1 μm to about 10 μm. A maximum thickness difference at the upper surface of the pad pattern 144 may be less than about 0.1 μm.

An entire lower surface of the pad pattern 144 may directly contact the redistribution pattern 140. When an element is referred to herein as being "directly on" or "directly connected" or "immediately adjacent" another element, no intervening elements are present. In contrast, an element referred to as being "on" or "connected to" or "adjacent" another element (e.g., a layer or substrate), can be directly on or connected to or adjacent the other element, or intervening elements may also be present. Thus, no barrier pattern and no seed layer pattern may be formed between the pad pattern 144 and the redistribution pattern 140. That is, an entirety of an interface between the pad pattern 144 and the redistribution pattern 140 may be planar, and may be free of a barrier pattern and a seed layer pattern.

The pad pattern 144 may include a metal, e.g., copper (Cu), ruthenium (Ru), nickel (Ni), gold (Au), tungsten (W), etc. A sidewall of the pad pattern 144 may have a slope without a bent portion. In example embodiments, the sidewall of the pad pattern 144 may be substantially vertical, e.g., free of a stepped portion. That is, the sidewall of the pad pattern 144 may linearly extend from the upper surface of the pad pattern 144 to an opposing lower surface of the pad pattern 144 that is directly on the upper surface of the redistribution pattern 140.

The insulating polymer layer 148 may extend on or cover the upper surface of the redistribution pattern 140, the lower sidewall of the pad pattern 144 and the upper surface of the first protective layer 132. However, the upper sidewall and the upper surface of the pad pattern 144 may not be covered by or may be free of the insulating polymer layer 148. An upper surface of the insulating polymer layer 148 may be lower than the upper surface of the pad pattern 144 relative to the substrate 100. The insulating polymer layer 148 may protect the redistribution pattern 140 and the lower sidewall of the pad pattern 144.

The insulating polymer layer 148 may include a material formed by curing a thermosetting photosensitive layer. The insulating polymer layer 148 may include, e.g., polyimide, polybenzoxazole (PBO), etc. Portions of the insulating polymer layer 148 on the upper surface of the redistribution line may be non-uniform in thickness. For example, a portion of the insulating polymer layer 148 on the lower sidewall of the pad pattern 144 may be thicker than a portion thereof on the upper surface of the redistribution pattern 140, but may be thinner than a portion thereof on the upper surface of the first protective layer 132.

The TSV structure 114a, the redistribution pattern 140, the pad pattern 144 and the insulating polymer layer 148 on the substrate 100 may form a lower chip.

The upper chip 200 may be bonded onto the lower chip. The upper chip 20 may include the upper pad pattern 202.

The conductive bump 204 may be formed between the upper pad pattern 202 in the upper chip 200 and the pad pattern 144 in the lower chip. Thus, a lower surface of the upper pad pattern 202 and the upper surface of the pad pattern 144 may be opposite to each other. The pad pattern 144, the conductive bump 204 and the upper pad pattern 202 may be stacked on the redistribution pattern 140.

In example embodiments, the conductive bump 204 may extend on or cover the upper surface and the upper sidewall of the pad pattern 144. The conductive bump 204 may extend on or cover the lower surface and a lower sidewall of the upper pad pattern 202. The conductive bump 204 may include, e.g., a solder ball. The upper pad pattern 202 and the pad pattern 144 may be electrically connected with each other via the conductive bump 204.

A non-conductive film (NCF) 150 may fill a gap between the upper chip 200 and the lower chip. The NCF 150 may be formed on sidewalls of the pad pattern 144, the conductive bump 204 and the upper pad pattern 202.

In example embodiments, the NCF 150 may be formed on the insulating polymer layer 148. The NCF 150 may not be formed between the conductive bump 204 and the pad pattern 144, such that an interface between the pad pattern 144 and the conductive bump 204 is free of the NCF 150. That is, the NCF 150 may not remain on the upper surface of the pad pattern 144.

Thus, failures due to the NCF between the conductive bump 204 and the pad pattern 202 may decrease, and the semiconductor device may have a high reliability.

FIGS. 2 to 17 are cross-sectional views illustrating example operations or stages of a method of manufacturing a semiconductor device in accordance with example embodiments.

Figure 2:
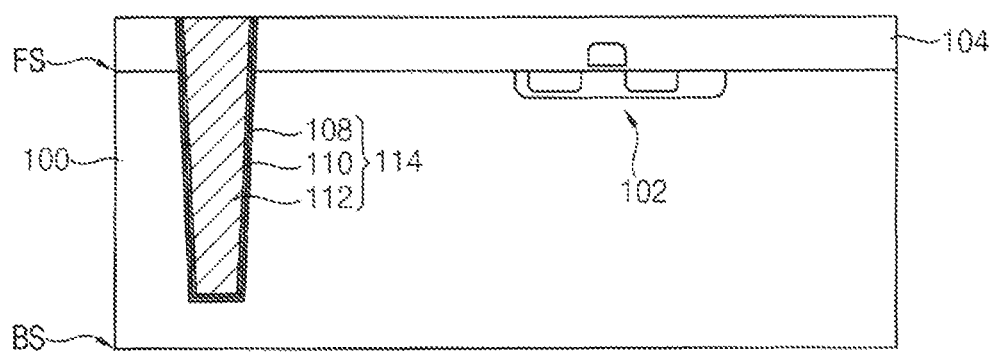
FIGS. 2 to 17 are cross-sectional views illustrating example operations or stages of a method of manufacturing a semiconductor device in accordance with example embodiments.

Referring to FIG. 2, a unit device 102 may be formed on a front side of a substrate 100. A first lower insulating interlayer 104 may be formed on the front side of the substrate 100 to extend on or cover the unit device 102. A preliminary TSV structure 114 may be formed through the first lower insulating interlayer 104 to extend into an inner portion of the substrate 100.

In example embodiments, the unit device 102 may include a MOS transistor. The lower insulating interlayer 104 may include, e.g., silicon oxide.

Hereinafter, forming the preliminary TSV structure 114 may be described.

A mask layer may be formed to cover an upper surface of the first lower insulating interlayer 104. The mask layer may include, e.g., silicon nitride. An etching mask for forming a TSV hole may be formed on the mask layer. The mask layer, the first lower insulating interlayer 104 and a portion of the substrate 100 may be etched using the etching mask to form the TSV hole.

A bottom of the TSV hole may be positioned at an inner portion of the substrate 100, that is, within the substrate 100 so as not to completely extend therethrough. After forming the TSV hole, the etching mask and the mask layer may be removed.

An insulating liner may be conformally formed on the first lower insulating interlayer 104 and an inner surface of the TSV hole. A TSV barrier layer and a TSV seed layer may be conformally formed on the insulating liner.

The insulating liner may be formed of, e.g., silicon oxide, silicon nitride, etc. The TSV barrier layer may be formed of, e.g., titanium (Ti), titanium nitride (TiN), titanium tungsten (TiW), tantalum (Ta), tantalum nitride (TaN), tungsten (W), tungsten nitride (WN), etc. The TSV seed layer may be formed of, e.g., copper (Cu), ruthenium (Ru), nickel (Ni), gold (Au), tungsten (W), etc.

A conductive layer may be formed on the TSV seed layer to fill the TSV hole. The conductive layer may be formed of, e.g., copper (Cu), ruthenium (Ru), nickel (Ni), gold (Au), tungsten (W), etc. In example embodiments, the conductive layer may be formed by an electroplating process using the TSV seed layer as a seed. For example, the TSV seed layer and the conductive layer may include copper. The copper included in the conductive layer may be formed by an electroplating process using the TSV seed layer including the copper as a seed.

In example embodiments, the TSV seed layer may include a material substantially the same as a material of the conductive layer. Thus, the TSV seed layer and the conductive layer may be merged as one conductive layer.

Upper portions of the conductive layer, the TSV barrier layer and the TSV liner layer may be planarized until the upper surface of the first lower insulating interlayer 104 may be exposed to form a preliminary TSV structure 114 including a preliminary TSV liner 108, a preliminary TSV barrier pattern 110 and a TSV contact 112. The planarization process may be performed by a chemical mechanical polishing (CMP) process.

In some example embodiments, the conductive layer may be planarized by the CMP process, and then the TSV barrier layer and the TSV liner layer on the first lower insulating interlayer 104 may be removed by a wet etching process.

Figure 3:
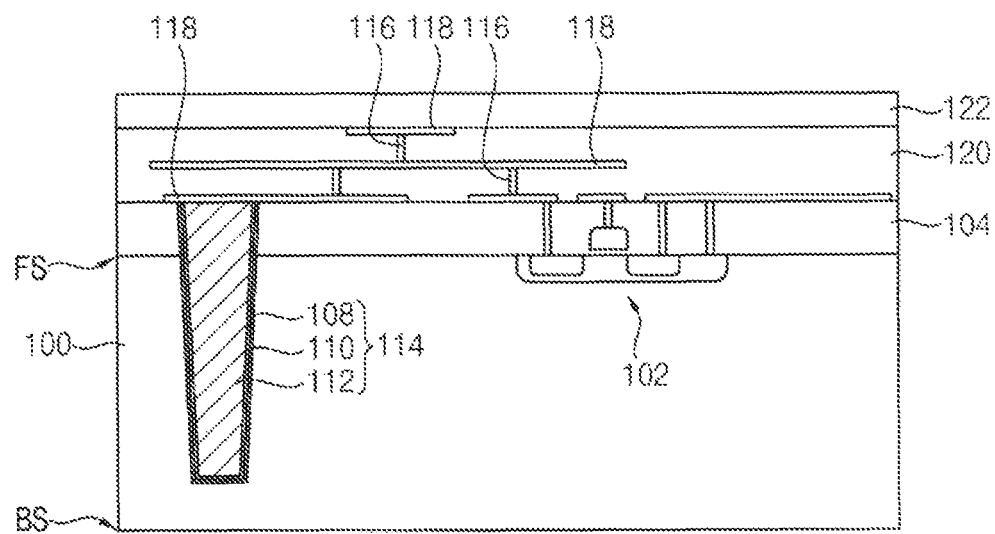

Referring to FIG. 3, internal wirings 116 and 118 may be formed on the first lower insulating interlayer 104 and the preliminary TSV structure 114. A second lower insulating interlayer 120 may be formed on the first lower insulating interlayer 104 to extend on or cover the internal wirings 116 and 118.

In example embodiments, the internal wirings 116 and 118 may include a plurality of internal via contacts 116 and a plurality of internal via conductive lines 118. A portion of the internal wirings 116 and 118 may be electrically connected with the preliminary TSV structure 114. The internal wirings 116 and 118 may include a conductive material, e.g., doped silicon, metal, metal silicide, metal alloy, metal compound, etc.

The second lower insulating interlayer 120 may be formed of, e.g., silicon oxide. The second lower insulating interlayer 120 may be a single layer or a multilayer.

A lower protective layer 122 may be formed on the second lower insulating interlayer 120. The lower protective layer 122 may be formed of, e.g., silicon nitride.

In FIGS. 4 to 14, the substrate 100 is turned over or reoriented so that the backside of the substrate 100 faces upwards.

Figure 4:
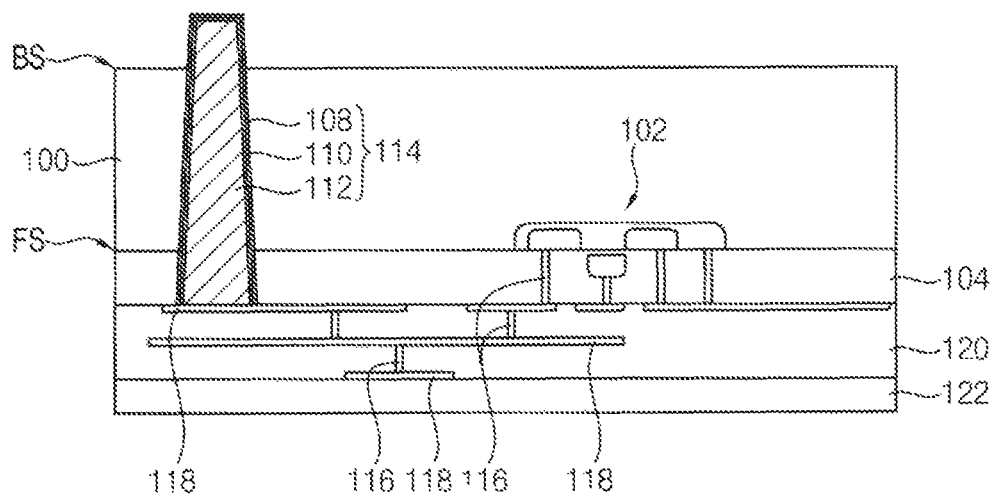

Referring to FIG. 4, a portion of the substrate 100 may be removed so that a surface of the preliminary TSV structure 114 may be exposed. Thus, a thickness of the substrate 100 may be decreased.

In example embodiments, a portion of the preliminary TSV structure 114 may protrude from the backside of the substrate 100. That is, an upper surface and a portion of a sidewall of the preliminary TSV structure 114 may be exposed.

In example embodiments, the removal of the portion of the substrate 100 may be performed by a grinding process and/or an etch back process.

Figure 5:
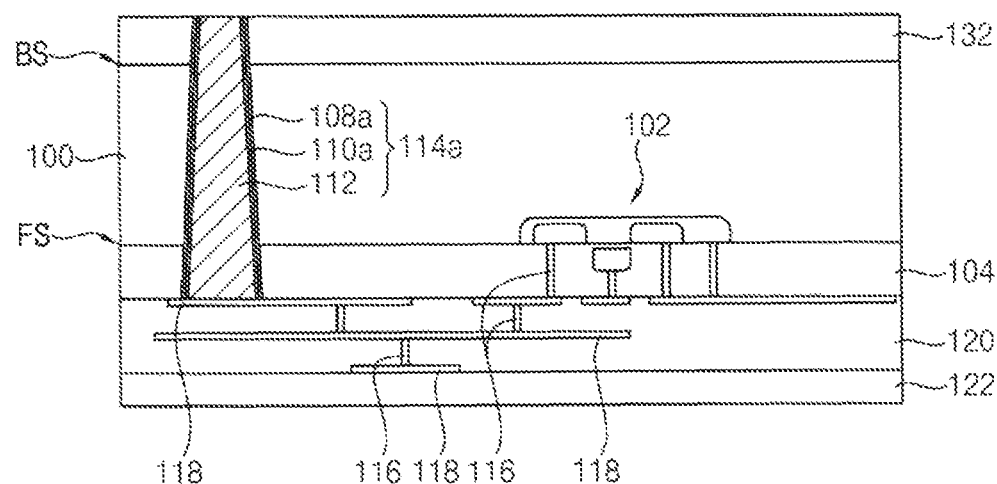

Referring to FIG. 5, a first protective layer 132 may be formed on the backside of the substrate 100 to cover the preliminary TSV structure 114. The first protective layer 132 may be a single layer or a multilayer. In example embodiments, the first protective layer 132 may be formed of, e.g., silicon oxide or silicon nitride. In some example embodiments, the first protective layer 132 may be formed of an insulating polymer, e.g., polyimide.

The first protective layer 132 and the preliminary TSV structure 114 may be planarized until a surface of the TSV contact 112 in the preliminary TSV structure 114 may be exposed.

The planarization process may be performed by a chemical mechanical polishing (CMP) process. Upper portions of the preliminary TSV liner 108 and the preliminary TSV barrier pattern 110 may be removed by the planarization process to form a TSV structure 114a exposing the surface of the TSV contact 112. The TSV structure 114a may include the TSV contact 112, a TSV liner 108a and a TSV barrier pattern 110a. The TSV contact 112 may extend through the first lower insulating interlayer 104, the substrate 100 and the first protective layer 132. The TSV liner 108a and the TSV barrier pattern 110a may extend on or surround a sidewall of the TSV contact 112.

Upper surfaces of the TSV structure 114a and the first protective layer 132 may be substantially coplanar with each other, and may be substantially flat.

Figure 6:
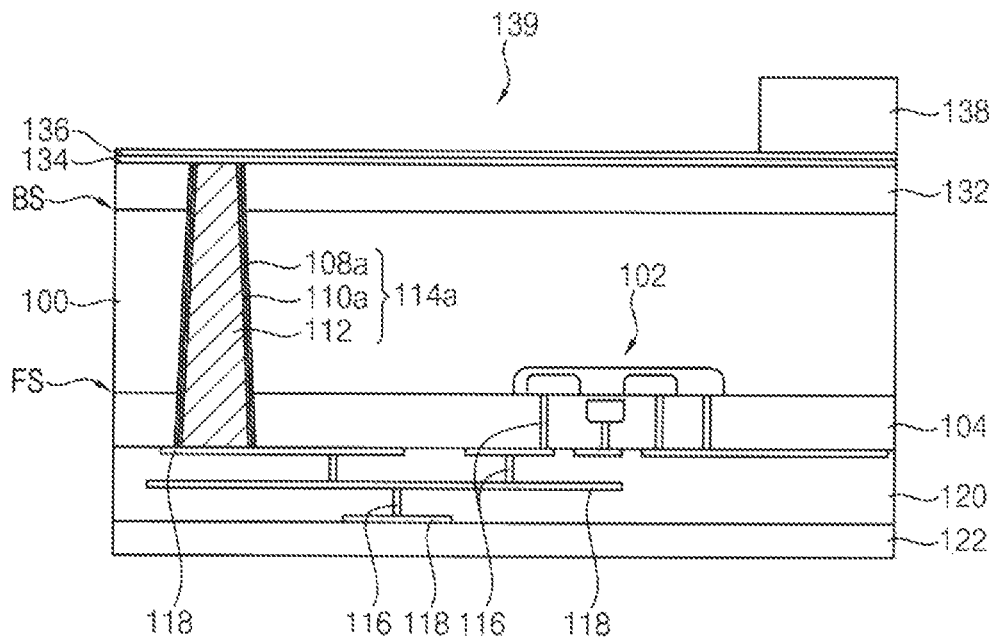

Referring to FIG. 6, a barrier layer 134 and a seed layer 136 may be sequentially formed on the TSV structure 114a and the first protective layer 132. A first mask pattern 138 for forming a redistribution pattern 140 (refer to FIG. 7) may be formed on the seed layer 136.

In example embodiments, the barrier layer 134 may be formed of, e.g., titanium (Ti), titanium nitride (TiN), titanium tungsten (TiW), tantalum (Ta), tantalum nitride (TaN), tungsten nitride (WN), etc. The barrier layer 134 may be a single layer or a multilayer. In example embodiments, the seed layer 136 may be formed of, e.g., copper (Cu), ruthenium (Ru), nickel (Ni), gold (Au), tungsten (W), etc.

The barrier layer 134 may be formed by a physical vapor deposition (PVD) process or metal organic chemical vapor deposition (MOCVD) process. The seed layer 136 may be formed by a PVD process.

The first mask pattern 138 may include a first opening 139 exposing a portion of the seed layer 136. The first opening 139 may overlap an upper surface of the TSV contact 112. In example embodiments, the first mask pattern 138 may include a photoresist pattern. For example, a photoresist film may be formed by a spin coating process, and the photoresist film may patterned by an exposure process and a developing process to form the first mask pattern 138.

Figure 7:
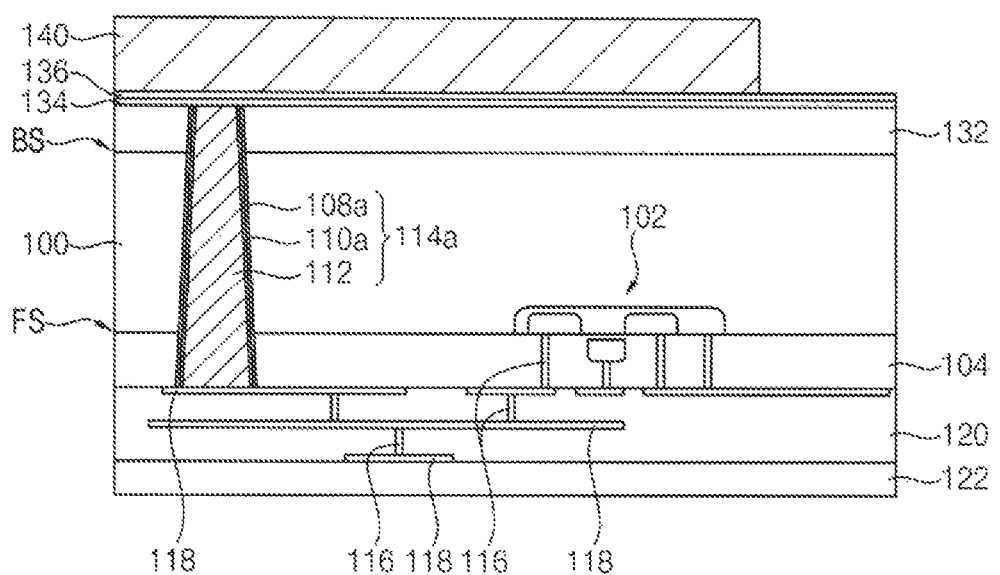

Referring to FIG. 7, the redistribution pattern 140 may be formed in the first opening 139. The redistribution pattern 140 may be formed of a metal, e.g., copper (Cu), ruthenium (Ru), nickel (Ni), gold (Au), tungsten (W), etc. The redistribution pattern 140 may be formed such that a conductive bump 204 (refer to FIGS. 16 and 17) through which electrical signals may be transferred between upper and lower chips may be formed at a desired position.

In example embodiments, the redistribution pattern 140 may be formed by an electroplating process using a seed layer as a seed. For example, the seed layer and the redistribution pattern 140 may include copper.

In example embodiments, the redistribution pattern 140 may be formed to have a thickness less than about 15 μm. For example, the redistribution pattern 140 may have a thickness of about 1 μm to about 15 μm. The redistribution pattern 140 may be formed to be thick, and may include a material having a low resistance. Thus, a resistance of the redistribution pattern 140 may decrease.

The first mask pattern 138 may be removed. After the removing process, the barrier layer 134 and the seed layer 136 may remain on the TSV contact 112 and the first protective layer 132.

A bottom of the first opening 139 may be substantially flat. Thus, a bottom and an upper surface of the redistribution pattern 140 may be substantially flat.

Figure 8:
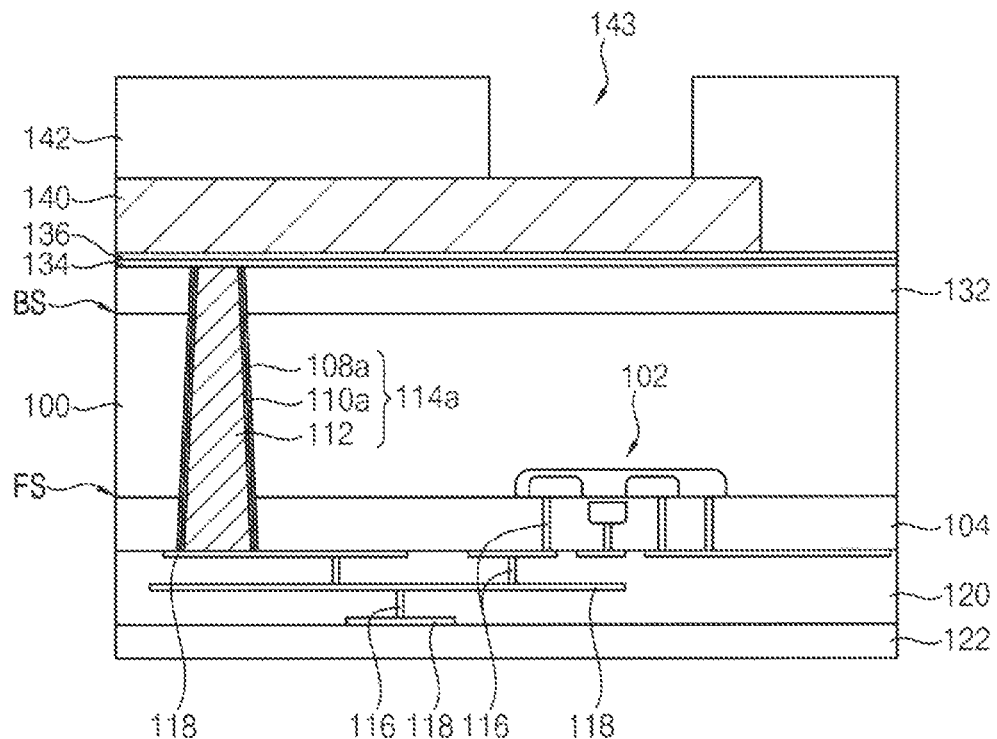

Referring to FIG. 8, a second mask pattern 142 for forming the pad pattern 144 (refer to FIG. 9) may be formed on the redistribution pattern 140 and the seed layer 136.

The second mask pattern 142 may include a second opening 143 exposing a region of the pad pattern 144. A portion of the upper surface of the redistribution pattern 140 may be exposed by the second opening 143. The second mask pattern 142 may cover other portions of the upper surface of the redistribution pattern 140 and an upper surface of the seed layer 136. The second mask pattern 142 may include a photoresist pattern.

Figure 9:
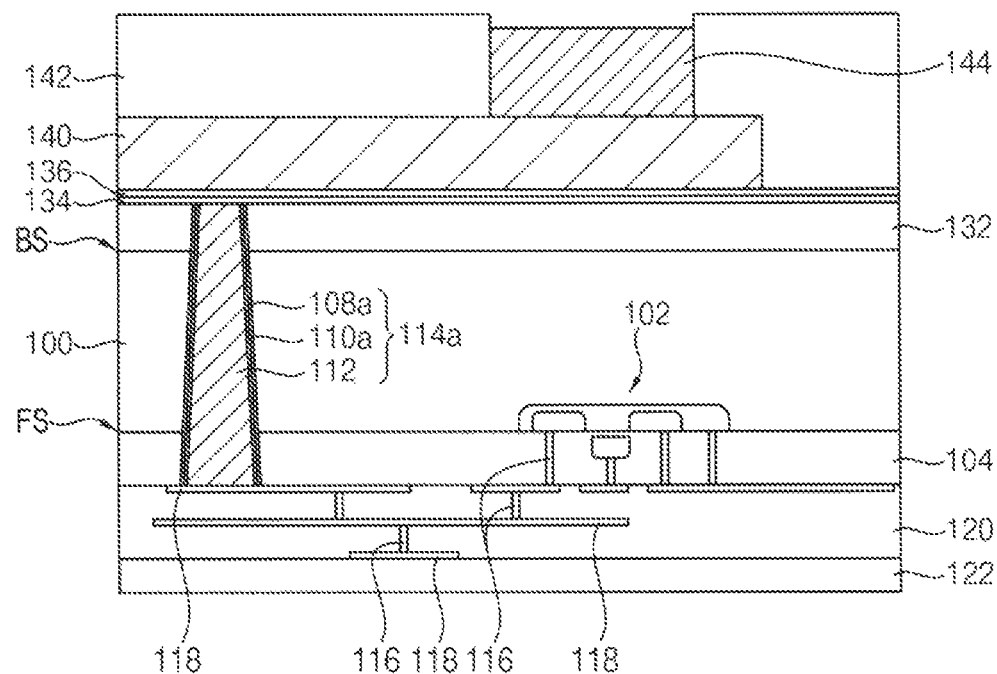

Referring to FIG. 9, the pad pattern 144 may be formed in the second opening 143. The pad pattern 144 may be formed of a metal, e.g., copper (Cu), ruthenium (Ru), nickel (Ni), gold (Au), tungsten (W), etc. In example embodiments, the pad pattern 144 may be formed by an electroplating process using the seed layer 136 as a seed. For example, the seed layer 136 and the pad pattern 144 may be formed of copper.

That is, when the redistribution pattern 140 and the pad pattern 144 are formed by respective electroplating processes, the seed layer 136 may be commonly used as a seed. Thus, no additional barrier layer and no addition seed layer for forming the pad pattern 144 may be formed. The pad pattern 144 may be formed by a simple process.

The upper surface of the redistribution pattern 140 may be substantially flat, so that a bottom or an upper surface of the pad pattern 144 on the redistribution pattern 140 may be substantially flat. In example embodiments, the pad pattern 144 may be formed to have a thickness of about 1 μm to about 10 μm. A maximum thickness difference at the upper surface of the pad pattern 144 may be less than about 0.1 μm.

An entire lower surface of the pad pattern 144 may contact the redistribution pattern 140. Thus, no barrier layer and no seed layer may be formed between the redistribution pattern 140 and the pad pattern 144, such that the interface between the pad pattern 144 and the redistribution pattern 140 may be free of a barrier pattern and a seed layer. The lower surface of pad pattern 144 may not contact an insulating polymer layer 148 (refer to FIG. 14) subsequently formed.

Figure 10:
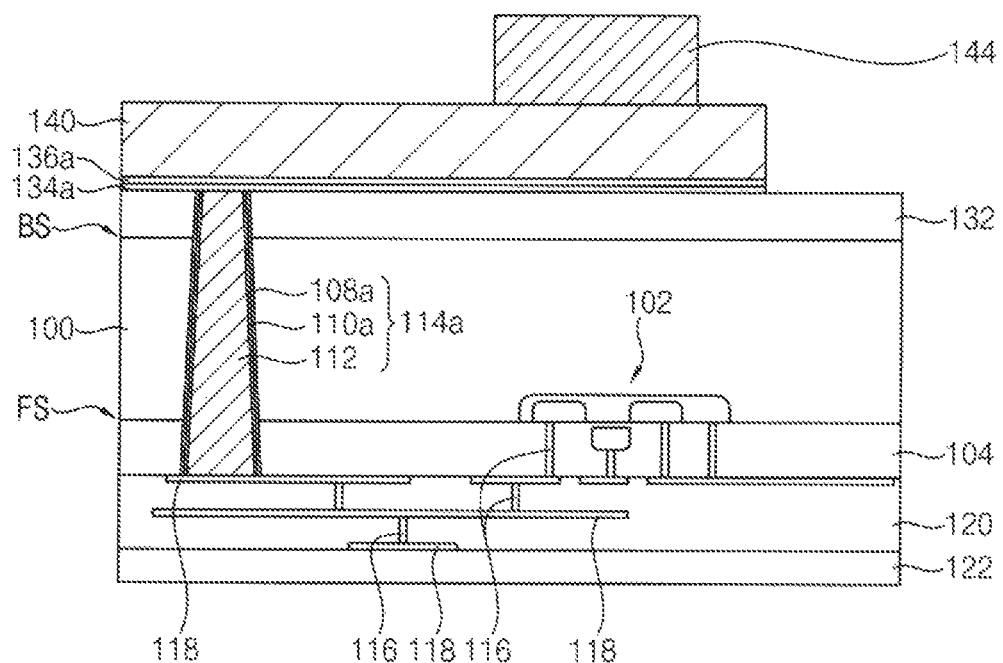
Figure 11:
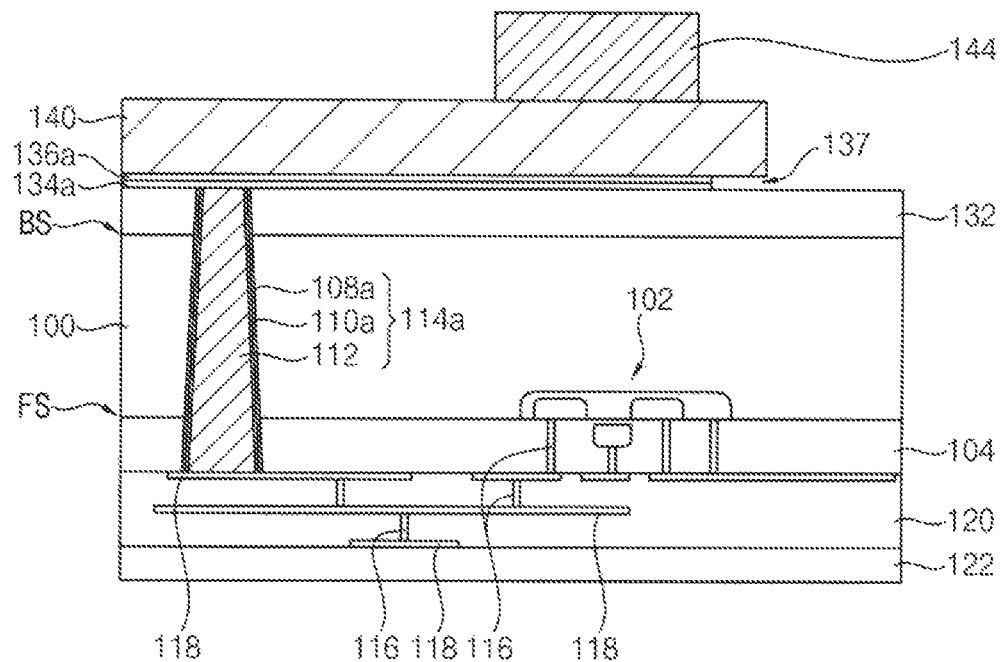

Referring to FIGS. 10 and 11, the second mask pattern 142 may be removed. Portions of the seed layer 136 and the barrier layer 134 exposed by the redistribution pattern 140 may be sequentially removed to form a seed layer pattern 136a and a barrier pattern 134a under the redistribution pattern 140.

In example embodiments, the second mask pattern 142 may be removed by an ashing process. The portions of the seed layer 136 and the barrier layer 134 may be removed by a wet etching process.

In example embodiments, as shown in FIG. 10, the portions of the seed layer 136 and the barrier layer 134 exposed by the redistribution pattern 140 may be selectively removed. Thus, the sidewalls of the barrier pattern 134a, the seed layer pattern 136a and the redistribution pattern 140 may be aligned or arranged in a vertical line.

In example embodiments, as shown in FIG. 11, during removing the seed layer 136 and the barrier layer 134 exposed by the redistribution pattern 140, the seed layer 136 and the barrier layer 134 under an edge portion of the redistribution pattern 140 may be partially etched. Thus, the sidewalls of the barrier pattern 134a and the seed layer pattern 136a and a sidewall of the redistribution pattern 140 may not be aligned or arranged in a vertical line. A portion adjacent the sidewalls of the barrier pattern 134a and the seed layer pattern 136a under the redistribution pattern 140 may be referred to as an undercut portion 137. In this case, the semiconductor device shown in FIG. 1B may be manufactured by subsequent processes.

Figure 12:
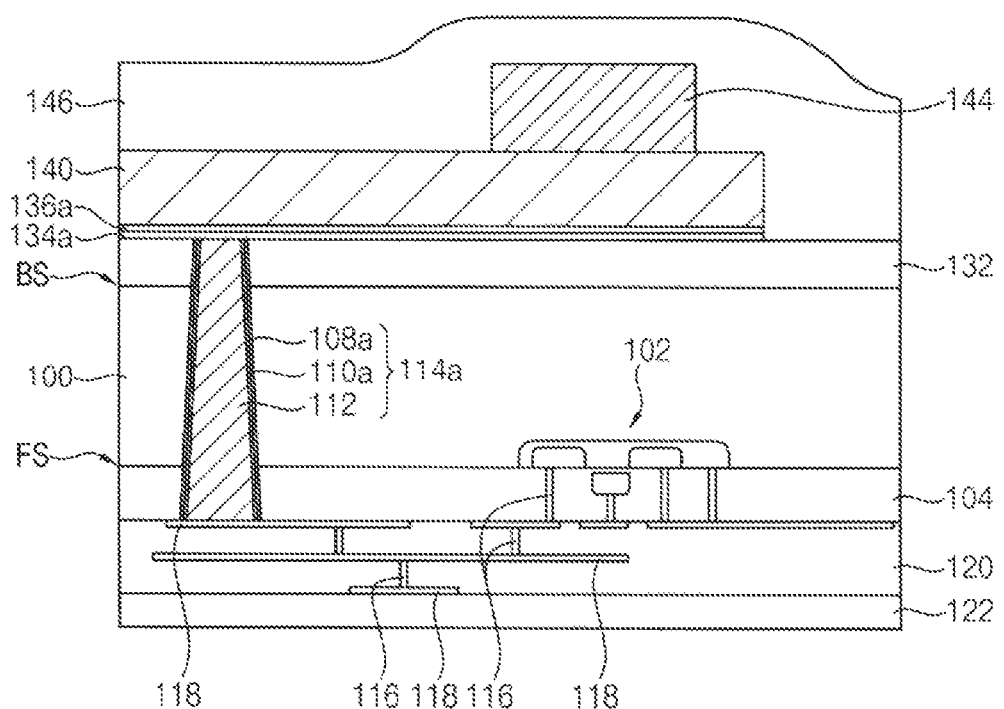

Referring to FIG. 12, a thermosetting photosensitive layer 146 may be formed to cover the redistribution pattern 140, the pad pattern 144 and the first protective layer 132. The thermosetting photosensitive layer 146 may be formed by a spin coating process.

The thermosetting photosensitive layer 146 may include a material of which a solubility may be changed by an exposure and may be hardened by heat. In example embodiments, the thermosetting photosensitive layer 146 may be a positive type in which a light-receiving portion may be removed by a developing process. In example embodiments, the thermosetting photosensitive layer 146 may include, e.g., polyimide, polyhydroxyamide (PHA), etc.

Upper surfaces of the redistribution pattern 140, the pad pattern 144 and the first protective layer 132 under the thermosetting photosensitive layer 146 may not be flat or planar, and may have a height difference from each other relative to the substrate 100. Thus, when the thermosetting photosensitive layer 146 is formed by the spin coating process, the thermosetting photosensitive layer 146 may be formed to have differences in thickness in a vertical direction according to positions thereof. An upper surface of the thermosetting photosensitive layer 146 may not be flat.

Particularly, a portion of the thermosetting photosensitive layer 146 on the first protective layer 132 having a lowest top surface may be formed to be relatively thick. A portion of the thermosetting photosensitive layer 146 on the pad pattern 144 having a highest top surface may be formed to be relatively thin. A thickness of the portion of the thermosetting photosensitive layer 146 on the pad pattern 144 may be less than a thickness of a portion of the thermosetting photosensitive layer 146 on the redistribution pattern 140. That is, the thickness of the portion of the thermosetting photosensitive layer 146 on the redistribution pattern 140 may be thicker than the portion thereof on the upper surface of the pad pattern 144, but thinner than the portion thereof on the upper surface of the first protective layer 132.

Figure 13:
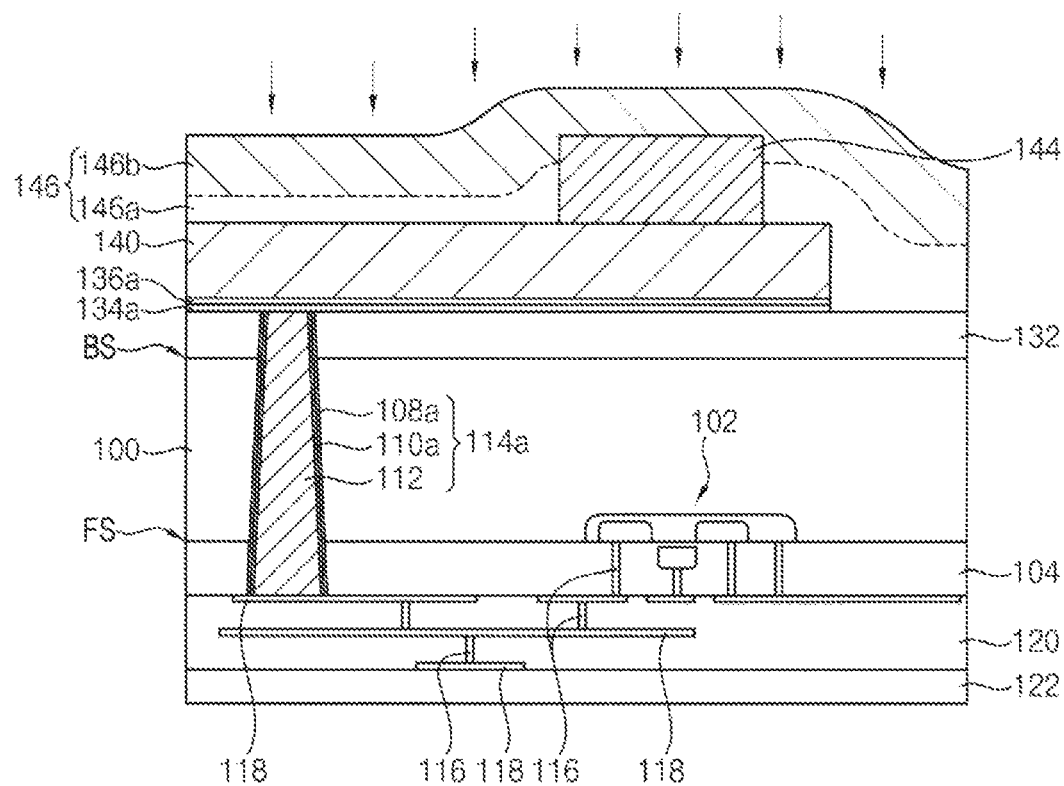

Referring to FIG. 13, an exposure process may be performed on the thermosetting photosensitive layer 146. In example embodiments, an exposure condition may be controlled so that only an upper portion of the thermosetting photosensitive layer 146 may be exposed and removed by a developer. That is, the thermosetting photosensitive layer 146 may include an exposure portion 146b and a non-exposure portion 146a.

Particularly, the exposure condition may be controlled so that a portion of the thermosetting photosensitive layer 146 on the upper surface of the pad pattern 144 may be removed and a lower portion of the thermosetting photosensitive layer 146 on the redistribution pattern 140 and the first protective layer 132 may remain after a subsequent developing process. The thermosetting photosensitive layer 146 may be exposed to a thickness greater than a thickness of the portion of the thermosetting photosensitive layer 146 on the upper surface of the pad pattern 144. The thermosetting photosensitive layer 146 may be exposed to a thickness less than a thickness of the portion of the thermosetting photosensitive layer 146 on the redistribution pattern 140 and the first protective layer 132. That is, a thickness of the exposure portion 146b may be greater than the thickness of the thermosetting photosensitive layer portion 146 on the pad pattern 144, but less than the thickness of the thermosetting photosensitive layer portions 146 on the redistribution pattern 140 or the first protective layer 132.

Figure 14:
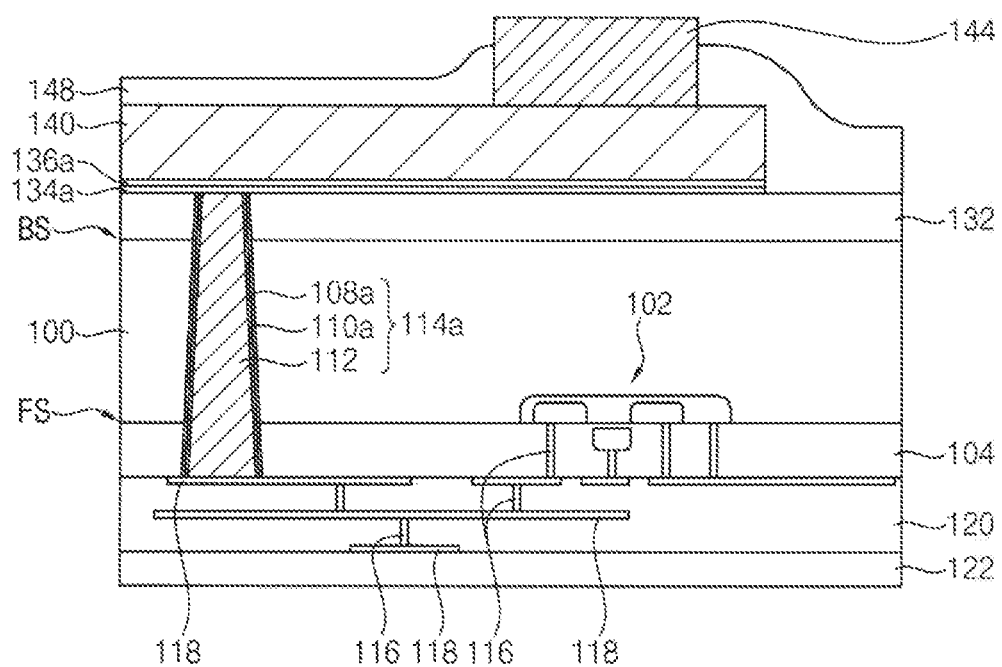

Referring to FIG. 14, the exposure portion 146b of the thermosetting photosensitive layer 146 may be removed by a developing process. After the developing process, a cleaning process of the upper surfaces of the thermosetting photosensitive layer 146 and the pad pattern may be further performed.

The thermosetting photosensitive layer 146 on the upper surface of pad pattern 144 may be completely removed by the developing and cleaning processes. Thermosetting photosensitive layer 146 on an upper sidewall of the pad pattern 144 may be removed together, i.e., in a same process step. Thus, the upper surface and the upper sidewall of pad pattern 144 may be exposed by the thermosetting photosensitive layer 146.

A thermal curing process for the thermosetting photosensitive layer 146 may be performed to form the insulating polymer layer 148.

In example embodiments, if the thermosetting photosensitive layer 146 is polyimide, the polyimide may be hardened by the thermal curing process. In some example embodiments, if the thermosetting photosensitive layer 146 is polyhydroxyamide, the polyhydroxyamide may be transformed to polybenzoxazole (PBO) by the thermal curing process.

The insulating polymer layer 148 may extend on or cover the redistribution pattern 140, the first protective layer 132 and the lower sidewall of the pad pattern 144. The upper sidewall and upper surface of the pad pattern 144 may be exposed by and free of the insulating polymer layer 148. An upper surface of the insulating polymer layer 148 may be lower than the upper surface of the pad pattern 144 relative to the substrate 100.

A lower device may be formed by the processes described above. The lower device may include a lower package or a wafer level lower package.

Figure 15:
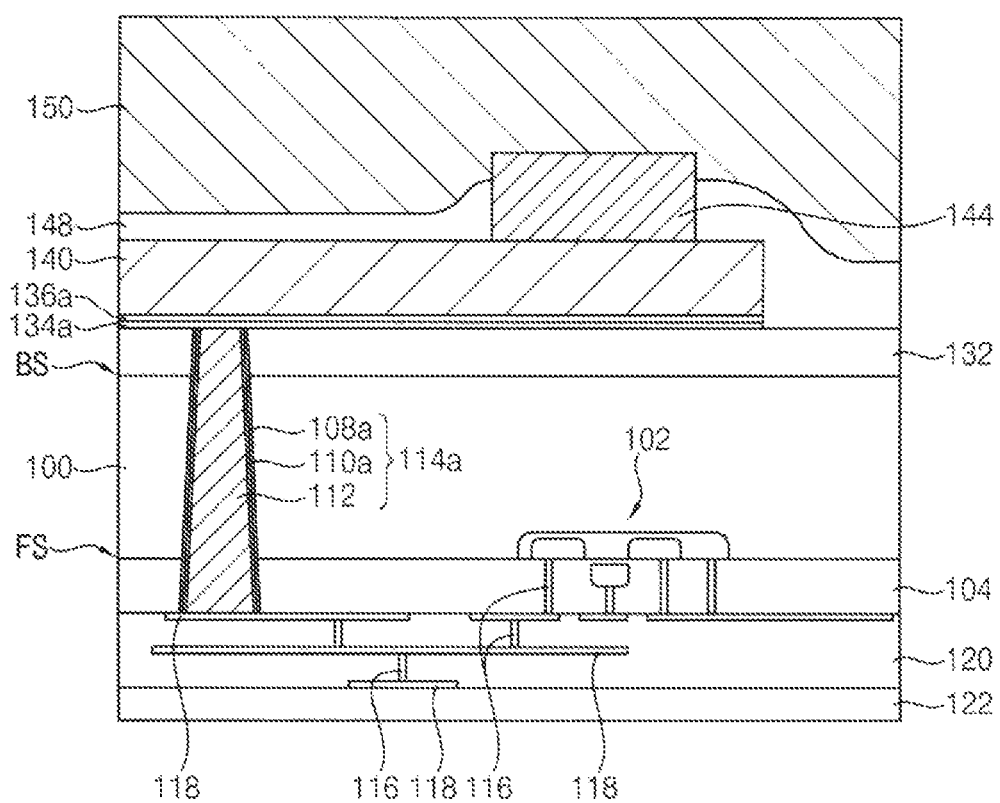

Referring to FIG. 15, an NCF 150 may be formed to cover the insulating polymer layer 148 and the pad pattern 144.

The NCF 150 may serve as an adhesion layer for bonding an upper chip with the lower chip using a conductive bump. The NCF 150 may serve as a filling material of a gap between the upper chip and the lower chip. Thus, the NCF 150 may be formed to have a thickness so that the NCF 150 may fill the gap between the upper chip and the lower chip in subsequent processes.

Figure 16:
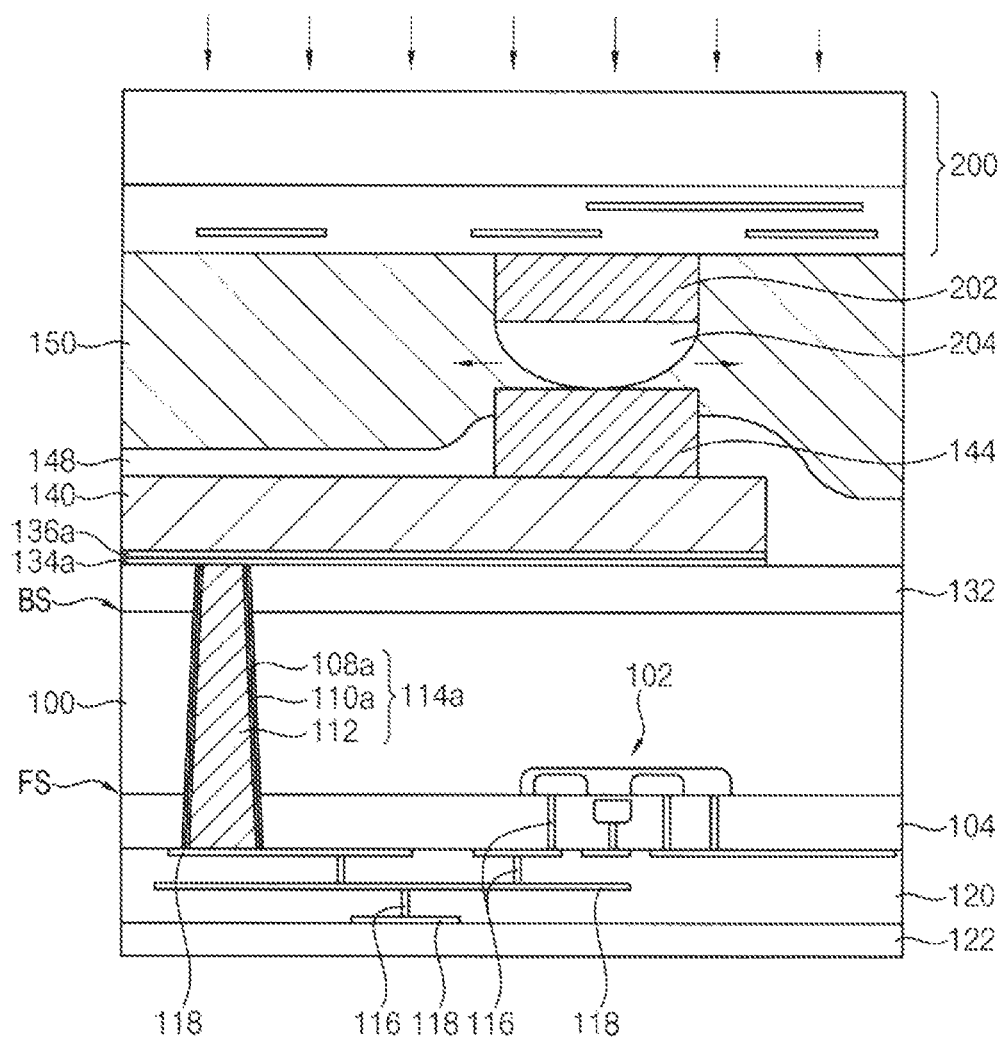
Figure 17:
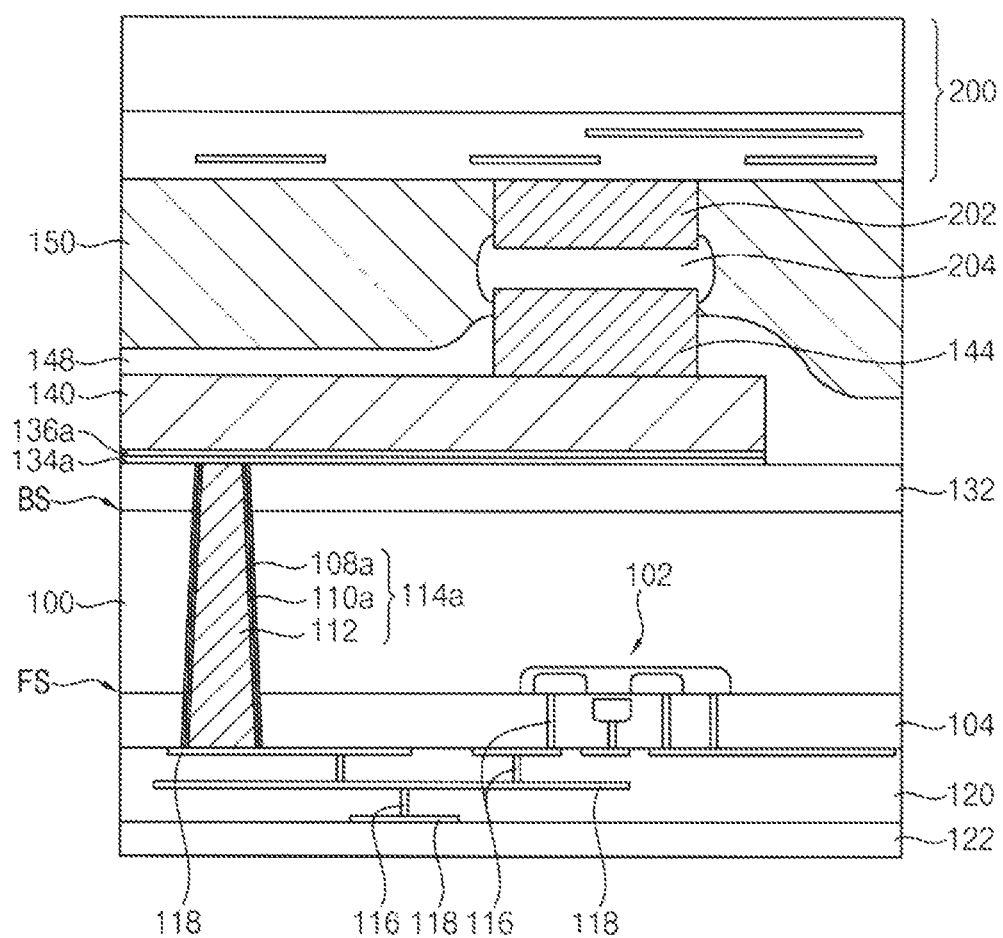

Referring to FIGS. 16 and 17, the upper chip 200 may be stacked or arranged vertically on the lower chip. In example embodiments, the upper chip 200 may be bonded onto the lower chip by a thermal compression nonconductive paste (TCNCP) process.

The upper chip 200 may include an upper pad pattern 202 and the conductive bump 204 on the upper pad pattern 202. The upper chip 200 may be electrically connected with the lower chip via the conductive bump 204. That is, the upper pad pattern 202 in the upper chip 200 may be opposite to the pad pattern 144, and may be pressed at a predetermined temperature. Thus, the conductive bump 204 may be bonded onto the pad pattern 144 in the lower chip. The NCF 150 may fill the gap between the lower chip and the upper chip 200, so that the lower chip and the upper chip 200 may be bonded to each other. The conductive bump 204 may include a solder ball.

As shown in FIG. 16, the conductive bump 204 may be aligned with the upper surface of the pad pattern 144, and the lower and upper chips may be pressed toward each other. In this case, the NCF 150 having fluidity may be pushed to sidewalls of the conductive bump 204. As the upper surface of the pad pattern 144 may be substantially planar or flat, the NCF 150 may not remain at a contact region or interface between the conductive bump 204 and the pad pattern 144, and the NCF 150 may be pushed to the sidewalls of the conductive bump 204. That is, the NCF 150 may not remain on the upper surface of the pad pattern 144. The NCF 150 may be formed on sidewalls of the pad pattern 144, the conductive bump 204 and the upper pad pattern 202.

As shown in FIG. 17, after the bonding process, the conductive bump 204 may extend on or cover the upper surface and an upper sidewall of the pad pattern 144. The conductive bump 204 may extend on or cover a lower surface and a lower sidewall of the upper pad pattern 202.

Thus, the contact region between the conductive bump 204 and the pad pattern 144 and a contact region between the conductive bump 204 and the upper pad pattern 202 may increase. A resistance of a stacked structure including the pad pattern 144, the conductive bump 204 and the upper pad pattern 202 may decrease. The conductive bump 204 may directly contact the pad pattern 144, and the insulating polymer layer 148 may not be formed on the contact region between the conductive bump 204 and the pad pattern 144.

If the upper surface of the pad pattern is not flat and includes a dimple (e.g., a depression in the upper surface), the NCF may not be pushed out of the dimple and may be trapped in the dimple during the bonding process of the lower and upper chips. Thus, the semiconductor device may have a low reliability, due to the NCF in the dimple.

In example embodiments, the conductive bump 204 may directly contact an upper surface of the pad pattern 144 that is free of depressions, and the NCF 150 may not remain between the conductive bump 204 and the pad pattern 144. That is, an interface between the pad pattern 144 and the conductive bump 204 is free of the NCF 150. Thus, the semiconductor device may have a high reliability.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   a protective layer on a substrate;
   a redistribution pattern on the protective layer, wherein an upper surface of the redistribution pattern is substantially flat;
   a seed layer and a barrier pattern between the redistribution pattern and the protective layer;
   a pad pattern directly on the redistribution pattern, wherein an upper surface of the pad pattern is substantially flat; and
   an insulating polymer layer on the redistribution pattern, the protective layer, and directly on a sidewall of the pad pattern, wherein a portion of an upper surface of the insulating polymer layer that is directly adjacent the sidewall of the pad pattern is lower than the upper surface of the pad pattern and is free of the pad pattern thereon.

2. The semiconductor device of claim 1, further comprising a through silicon via (TSV) structure extending through the substrate and into the protective layer.

3. The semiconductor device of claim 1, wherein the insulating polymer layer comprises polyimide or polybenzoxazole.

4. The semiconductor device of claim 1, further comprising:
   an upper chip stacked on the substrate and an upper pad pattern beneath the upper chip, the upper pad pattern being opposite to the upper surface of the pad pattern;
   a conductive bump between the pad pattern and the upper pad pattern, wherein the upper pad pattern and the pad pattern are electrically connected via the conductive bump; and
   a non-conductive film (NCF) between the insulating polymer layer and the upper chip, wherein the insulating polymer layer and the upper chip are bonded by the NCF.

5. A semiconductor device, comprising:
   a through silicon via (TSV) structure extending through a substrate;
   a redistribution pattern on a backside of the substrate, the redistribution pattern and the TSV structure being electrically connected;
   a pad pattern directly on the redistribution pattern, wherein an upper surface of the pad pattern is substantially flat;
   an insulating polymer layer on an upper surface of the redistribution pattern and a lower portion of a sidewall of the pad pattern;
   a seed layer and a barrier pattern on a lower surface of the redistribution pattern opposite the upper surface thereof;

an upper chip stacked on the substrate and an upper pad pattern beneath the upper chip, the upper pad pattern being opposite to the upper surface of the pad pattern;

a conductive bump between the pad pattern and the upper pad pattern, wherein the upper pad pattern and the pad pattern are electrically connected via the conductive bump; and a non-conductive film (NCF) in a gap between the insulating polymer layer and the upper chip, wherein the insulating polymer layer and the upper chip are bonded by the NCF.

6. The semiconductor device of claim 5, wherein the upper surface of the redistribution pattern and the lower surface of the redistribution pattern opposite thereto are substantially flat.

7. The semiconductor device of claim 5, further comprising a protective layer on the backside of the substrate, wherein upper surfaces of the TSV structure and the protective layer are substantially coplanar.

8. The semiconductor device of claim 5, wherein the sidewall of the pad pattern linearly extends from the upper surface thereof that is contacting the conductive bump to an opposing lower surface thereof that is directly on the redistribution pattern.

9. The semiconductor device of claim 5, wherein the pad pattern has a thickness of about 1 micrometer (μm) to about 10 μm, and a maximum thickness difference at the upper surface of the pad pattern is less than about 0.1 μm.

10. The semiconductor device of claim 5, wherein a portion of an upper surface of the insulating polymer layer, which is directly adjacent the lower portion of the sidewall of the pad pattern, is lower than the upper surface of the pad pattern and is free of the pad pattern thereon.

11. The semiconductor device of claim 5, wherein the conductive bump contacts the upper surface and an upper portion of the sidewall of the pad pattern and a lower surface and a sidewall of the upper pad pattern.

12. The semiconductor device of claim 5, wherein the NCF is on a sidewall of a stacked structure comprising the pad pattern, the conductive bump and the upper pad pattern.

13. A semiconductor device, comprising:
a protective layer on a substrate;
a redistribution pattern on the protective layer;
a seed layer and a barrier pattern between the redistribution pattern and the protective layer, a pad pattern comprising a lower surface directly on the redistribution pattern, an upper surface contacting a conductive bump and opposite the lower surface, and a sidewall that linearly extends from the upper surface to the lower surface, wherein a first interface between the lower surface and the redistribution pattern is planar; and an insulating polymer layer on the redistribution pattern and directly on the sidewall of the pad pattern.

14. The semiconductor device of claim 13, wherein the insulating polymer layer comprises a photosensitive layer, and wherein a first thickness of the insulating polymer layer directly on the sidewall of the pad pattern is greater than a second thickness thereof on the redistribution pattern.

15. The semiconductor device of claim 14, further comprising:
an upper chip comprising an upper pad pattern that is stacked on the pad pattern opposite the substrate;
the conductive bump extending between and electrically connecting the upper surface of the pad pattern to a surface of the upper pad pattern; and
a non-conductive film (NCF) extending between and bonding the insulating polymer layer and the upper chip, wherein a second interface between the upper surface of the pad pattern and the conductive bump is free of the NCF.

16. The semiconductor device of claim 15, wherein the conductive bump extends on the sidewall of the pad pattern and on a sidewall of the upper pad pattern.

17. The semiconductor device of claim 13, wherein the pad pattern and the redistribution pattern are plated layers comprising a same material as the seed layer, and wherein the first interface between the lower surface of the pad pattern and the redistribution pattern is free of a barrier pattern and a seed layer.

18. The semiconductor device of claim 1, wherein the sidewall of the pad pattern linearly extends from the upper surface thereof that is contacting a conductive bump to an opposing lower surface thereof that is directly on the redistribution pattern, and wherein a side surface of the insulating polymer layer is directly on a lower portion of the sidewall.

19. The semiconductor device of claim 1, wherein the upper surface of the insulating polymer layer is not flat.

20. The semiconductor device of claim 13, wherein an upper surface of the insulating polymer layer is not flat.

* * * * *